(12) United States Patent
Hwang et al.

(10) Patent No.: US 8,309,968 B2
(45) Date of Patent: Nov. 13, 2012

(54) SCHOTTKY DIODE WITH DIAMOND ROD AND METHOD FOR MANUFACTURING THE SAME

(75) Inventors: Jenn-Chang Hwang, Hsinchu (TW);
Chwung-Shan Kou, Hsinchu (TW);
Jian-You Lin, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 154 days.

(21) Appl. No.: 12/847,078

(22) Filed: Jul. 30, 2010

(65) Prior Publication Data
US 2011/0297962 A1    Dec. 8, 2011

(30) Foreign Application Priority Data
Jun. 8, 2010 (TW) ................................ 99118555 A

(51) Int. Cl.
*H01L 31/0312*    (2006.01)
*H01L 29/47*    (2006.01)
*H01L 21/28*    (2006.01)

(52) U.S. Cl. .......... 257/77; 257/471; 257/E29.338; 257/E21.045; 438/570

(58) Field of Classification Search .......... 257/77, 257/E21.045, E29.338, 267, 417, 473; 438/570, 438/571, 572
See application file for complete search history.

(56) References Cited

U.S. PATENT DOCUMENTS
5,285,084 A * 2/1994 von Windheim et al. ........ 257/77
2005/0121706 A1* 6/2005 Chen et al. ..................... 257/288

OTHER PUBLICATIONS

Ando et al., "'Nano-rods' of single crystalline diamond". 2004, Diamond and Related Materials, Vo. 13, pp. 633-637 (May 2004).*
Moazed et al., "A thermally activated solid state reaction process for fabrication ohmic contacts to semiconductor diamond", 1990, J. Appl. Phys., vol. 65, No. 5, pp. 2246-2254 (Sep. 1, 1990).*

* cited by examiner

*Primary Examiner* — A. Sefer
*Assistant Examiner* — Nikolay Yushin
(74) *Attorney, Agent, or Firm* — Muncy, Geissler, Olds & Lowe, PLLC

(57) ABSTRACT

The present invention relates to a Schottky diode with a diamond rod, which comprises: a substrate with a gate layer formed thereon; a patterned insulating layer disposed on the gate layer, wherein the patterned insulating layer comprises a first contact region and a second contact region; a diamond rod disposed on the patterned insulating layer, wherein a first end of the diamond rod connects to the first contact region, and a second end of the diamond rod connects to the second contact region; a first electrode corresponding to the first contact region of the patterned insulating layer, and covering the first end of the diamond rod; and a second electrode corresponding to the second contact region of the patterned insulating layer, and covering the second end of the diamond rod, and a method for manufacturing the same.

19 Claims, 3 Drawing Sheets

SCHOTTKY DIODE WITH DIAMOND ROD AND METHOD FOR MANUFACTURING THE SAME

BACKGROUND OF THE INVENTION

1. Field of the Invention

The present invention relates to a Schottky diode with a diamond rod and a method for manufacturing the same and, more particularly, to a Schottky diode with a diamond rod prepared from a polycrystalline diamond, and a method for manufacturing the same. Hence, the Schottky diode with a diamond rod has the properties of high efficiency and low production cost.

2. Description of Related Art

A Schottky diode is a semiconductor diode with a low forward voltage drop and a very fast switching action. In the structure of the Schottky diode, a Schottky junction generated from the contact of a metal and a semiconductor can exhibit fast switching property in the Schottky diode. Hence, the Schottky diode can be applied on an inductor or a capacitor with small size, and the efficiency of a power supply can be improved. Generally, the Schottky diode can be applied to various circuit systems or electronic devices, such as amplifiers, receivers, and RF detectors. In addition, the Schottky diode can also be applied to rectifiers with high frequency.

Suitable semiconductor materials for the Schottky diode are SiC, GaN, or diamond. Among the above materials, diamond is an excellent material for electronic devices, due to its properties of corrosion resistance and high-temperature resistance. In recent years, it is known that the Schottky diode with diamond as the semiconductor material has a high on/off ratio.

In the conventional process for manufacturing a Schottky diode with diamond as a semiconductor material, a diamond film with single crystal structure is grown on a silicon wafer, and then a metal layer is coated thereon to form a Schottky junction between the diamond film and the metal layer. However, the process for growing the diamond film with single crystal structure is very expensive. Hence, the product cost is greatly increased when the Schottky diode with diamond is applied on the electronic devices.

In order to decrease the production cost of the Schottky diode and prepare a Schottky diode with a high on/off ratio to apply on various electronic devices, it is desirable to provide a Schottky diode and a method for manufacturing the same to provide a Schottky diode through an inexpensive way.

SUMMARY OF THE INVENTION

The object of the present invention is to provide a Schottky diode with a diamond rod, which is a low-cost Schottky diode with a high on/off ratio.

Another object of the present invention is to provide a method for manufacturing a Schottky diode with a diamond rod, wherein it is possible to prepare a Schottky diode with a high on/off ratio from a low-cost diamond film with a poly-crystalline structure.

To achieve the object, the Schottky diode with a diamond rod of the present invention includes: a substrate with a gate layer formed thereon; a patterned insulating layer disposed on the gate layer, wherein the patterned insulating layer comprises a first contact region and a second contact region; at least one diamond rod disposed on the patterned insulating layer, wherein a first end of the diamond rod connects to the first contact region, and a second end of the diamond rod connects to the second contact region; a first electrode corresponding to the first contact region of the patterned insulating layer, and covering the first end of the diamond rod; and a second electrode corresponding to the second contact region of the patterned insulating layer, and covering the second end of the diamond rod.

In addition, the method for manufacturing a Schottky diode with a diamond rod of the present invention comprises the following steps: (A) providing a substrate with a gate layer formed thereon; (B) forming a patterned insulating layer on the gate layer, wherein the patterned insulating layer comprises a first contact region and a second contact region; (C) placing at least one diamond rod on the patterned insulating layer, wherein first end of the diamond rod connects to the first contact region, and a second end of the diamond rod connects to the second contact region; (D) forming a first electrode and a second electrode respectively, wherein the first electrode corresponds to the first contact region of the patterned insulating layer and covers the first end of the diamond rod, and the second electrode corresponds to the second contact region of the patterned insulating layer and covers the second end of the diamond rod.

Hence, compared to the Schottky diode manufactured through directly growing a diamond film with a single-crystalline structure on a substrate, the production costs of the diamond rod used in the Schottky diode and the method for manufacturing the same of the present invention are both very low. In addition, the diamond rod used in the Schottky diode of the present invention still has the property of corrosion-resistance and high voltage-resistance, and the Schottky diode still exhibits great switching action.

According to the method for manufacturing the Schottky diode of the present invention, the at least one diamond rod in the step (C) is prepared through the following steps: (1) providing a diamond film; (2) etching the diamond film to form plural diamond rods; and (3) selecting at least one diamond rod. Preferably, the diamond film is a poly-crystalline diamond film.

In the present invention, a poly-crystalline diamond film with low production cost is used to prepare plural diamond rods through an etching process, and then diamond rods with single-crystalline or bi-crystalline structure are selected to prepare the Schottky diode of the present invention. Hence, the production cost of the Schottky diode with a diamond rod of the present invention is much lower than that of the conventional Schottky diode with a single-crystalline diamond film.

According to the Schottky diode with a diamond rod and the method for manufacturing the same of the present invention, the at least one diamond rod may be respectively a single-crystalline diamond rod, or a bi-crystalline diamond rod. Preferably, the at least one diamond rod is respectively a single-crystalline diamond rod doped with boron, an intrinsic single-crystalline diamond rod, a bi-crystalline diamond rod doped with boron, or an intrinsic bi-crystalline diamond rod. More preferably, the at least one diamond rod is a single-crystalline diamond rod doped with boron, or a bi-crystalline diamond rod doped with boron. Most preferably, the at least one diamond rod is a single-crystalline diamond rod doped with boron.

According to the Schottky diode with a diamond rod and the method for manufacturing the same of the present invention, the gate layer may be an $SiO_2$ film. In addition, the material of the patterned insulating layer may be AlN, or $SiO_2$. Furthermore, the substrate may be a silicon wafer, or a silicon substrate.

According to the Schottky diode with a diamond rod and the method for manufacturing the same of the present invention, the first electrode serves as an ohmic electrode, which can be a Ti/Al bi-layered electrode, or a Ti/Au bi-layered electrode. In addition, the second electrode serves as a Schottky electrode, which can be an Al electrode, a Pt electrode, or an Ni electrode.

Hence, according to the Schottky diode with a diamond rod and the method for manufacturing the same of the present invention, a poly-crystalline diamond film is etched to form diamond rods, and then diamond rods with a single-crystalline or a bi-crystalline structure are selected to prepare the Schottky diode of the present invention. The poly-crystalline diamond film is much cheaper than the single-crystalline diamond film, so the production cost of the Schottky diode with a diamond rod of the present invention is much lower than that of the Schottky diode using a single-crystalline diamond film. In addition, the diamond rod used in the Schottky diode of the present invention still has a single-crystalline or a bi-crystalline structure, so the Schottky diode still can exhibit excellent on/off characteristics.

DETAILED DESCRIPTION OF THE PREFERRED EMBODIMENT

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

Embodiment 1—Preparation of a Schottky Diode with an Intrinsic Diamond Rod

[Preparation of Diamond Rods]

Figure 1A:
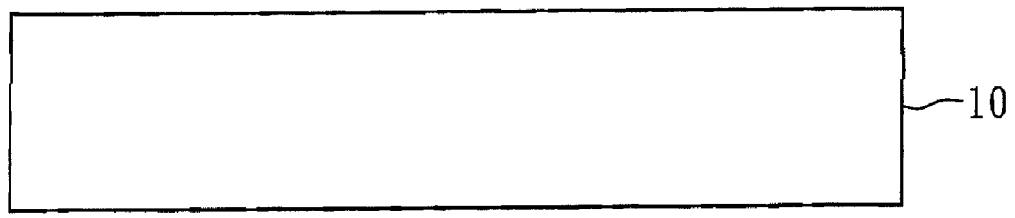
FIGS. 1A and 1B are cross-sectional views showing the process for manufacturing diamond rods in Embodiment 1 of the present invention.
Figure 1B:
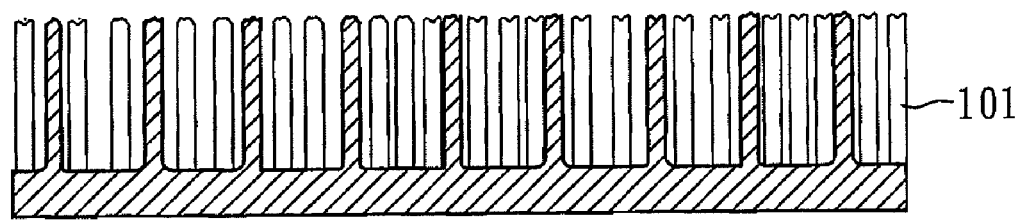

FIGS. 1A to 1B are cross-sectional views showing the process for manufacturing diamond rods of the present embodiment.

As shown in FIG. 1A, a diamond film 10 is provided. In the present embodiment, the diamond film 10 is a poly-crystalline diamond film. Then, as shown in FIG. 1B, the diamond film 10 is etched with an oxygen plasma to form plural diamond rods 101. The size and the width of the diamond rods 101 can be controlled by adjusting the energy of the oxygen plasma. In the present embodiment, the length of the diamond rod 101 is about 4 μm, and the width is about 600 nm.

Finally, diamond rods with a single-crystalline or bi-crystalline structure were selected from the plural diamond rods 101, and the selected diamond rod is used in the following process for preparing a Schottky diode.

[Preparation a Schottky Diode with a Diamond Rod]

FIGS. 2A to 2E are cross-sectional views showing the process for manufacturing a Schottky diode with a diamond rod of the present embodiment.

Figure 2A:
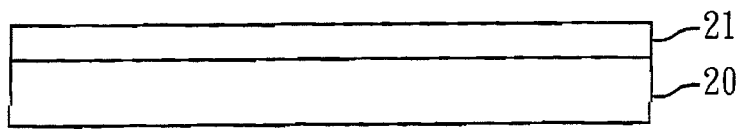
FIGS. 2A to 2E are cross-sectional views showing the process for manufacturing a Schottky diode with a diamond rod in Embodiment 1 of the present invention.

As shown in FIG. 2A, a substrate 20 is provided, which is a silicon wafer. Then, an $SiO_2$ film is grown on the substrate 20 to form a gate layer 21. In the present embodiment, the thickness of the gate layer 21 is 500 nm.

Figure 2B:
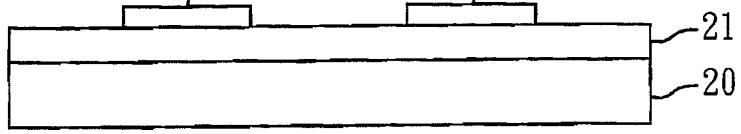

As shown in FIG. 2B, an insulating layer is grown on the gate layer 21, and the material of the insulating layer can be AlN or $SiO_2$. In the present embodiment, the material of the insulating layer is $SiO_2$. Then, a lithography process is performed to pattern the insulating layer, and a patterned insulating layer 22 comprising a first contact region 221, and a second contact region 222 is obtained.

Figure 2C:
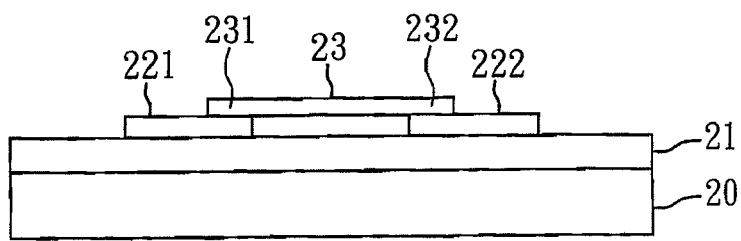

As shown in FIG. 2C, a glass needle is used to pick a diamond rod 23 with a single-crystalline structure from the above-prepared diamond rods under an optical microscope. Then, the diamond rod 23 is placed on the patterned insulating layer 22. Herein, the first end 231 (i.e. one end) of the diamond rod 231 connects to the first contact region 221, and the second end 232 (i.e. the other end) of the diamond rod 231 connects to the second contact region 222.

Figure 2D:
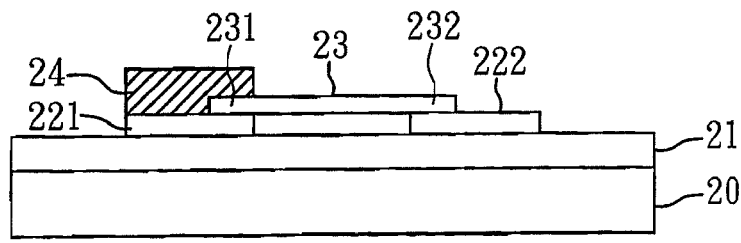

As shown in FIG. 2D, Ti is coated on the patterned insulating layer 22, and Al is coated thereon sequentially. Then, a rapid thermal anneal (RTA) process is performed on the metal layer of Ti and Al at 600° C. for 5 min. After the RTA process, the metal layer of Ti and Al is patterned through a lithography process to obtain a first electrode 24 as an ohmic electrode. Herein, the first electrode 24 corresponds to the first contact region 221 of the patterned insulating layer 22 and covers the first end 231 of the diamond rod 23, and the first electrode 24 is a Ti/Al bi-layered electrode.

Figure 2E:
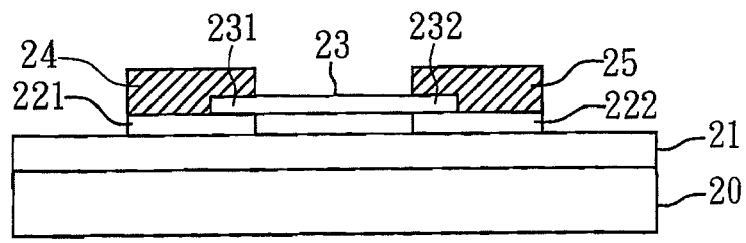

Finally, as shown in FIG. 2E, Ti is coated on the patterned insulating layer 22, and the metal layer of Ti is patterned through a lithography process to obtain a second electrode 25 as a Schottky electrode. Herein, the second electrode 25 corresponds to the second contact region 222 of the patterned insulating layer 22 and covers the second end 232 of the diamond rod 23.

After the aforementioned process, a Schottky diode with a diamond rod of the present embodiment is obtained, which comprises: a substrate 20 with a gate layer 21 formed thereon; a patterned insulating layer 22 disposed on the gate layer 21, wherein the patterned insulating layer 22 comprises a first contact region 221 and a second contact region 222; a diamond rod 23 disposed on the patterned insulating layer 22, wherein a first end 231 of the diamond rod 23 connects to the first contact region 221, and a second end 232 of the diamond rod 23 connects to the second contact region 222; a first electrode 24 corresponding to the first contact region 221 of the patterned insulating layer 22, and covering the first end 231 of the diamond rod 23; and a second electrode 25 corresponding to the second contact region 222 of the patterned insulating layer 22, and covering the second end 232 of the diamond rod 23.

[Evaluation of the Characteristic of the Schottky Diode with an Intrinsic Diamond Rod]

Figure 3:
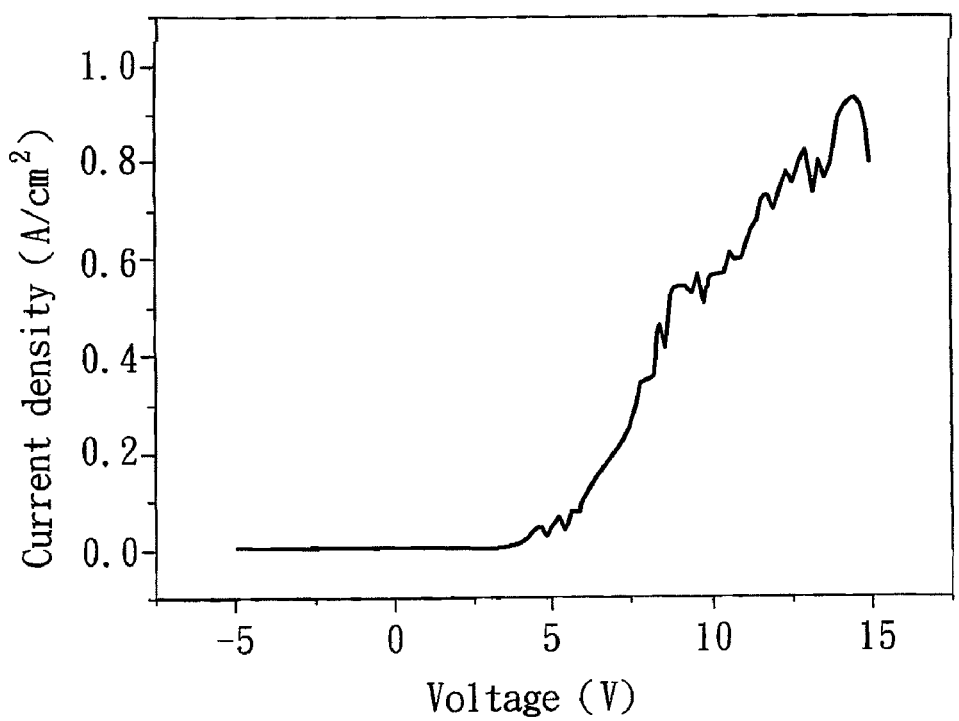
FIG. 3 is a current density-voltage curve of a Schottky diode with a diamond rod in Embodiment 1 of the present invention.

FIG. 3 is a current density-voltage curve of a Schottky diode with a diamond rod of the present embodiment.

According to the result shown in FIG. 3, the Schottky diode with a diamond rod of the present embodiment has good on/off characteristics, and the on/off ratio of the Schottky diode is about 1000.

Embodiment 2—Preparation of a Schottky Diode with an Intrinsic Diamond Rod

The structure of the Schottky diode with a diamond rod and the method for manufacturing the same of the present embodiment are the same as those described in Embodiment 1, except the intrinsic polycrystalline diamond film is substituted with a polycrystalline diamond film doped with boron in the present embodiment. Hence, in the present embodiment, the diamond rod is a single-crystalline diamond rod doped with boron, or a bi-crystalline diamond rod doped with boron.

[Evaluation of the Characteristic of the Schottky Diode with an Intrinsic Diamond Rod]

Figure 4:
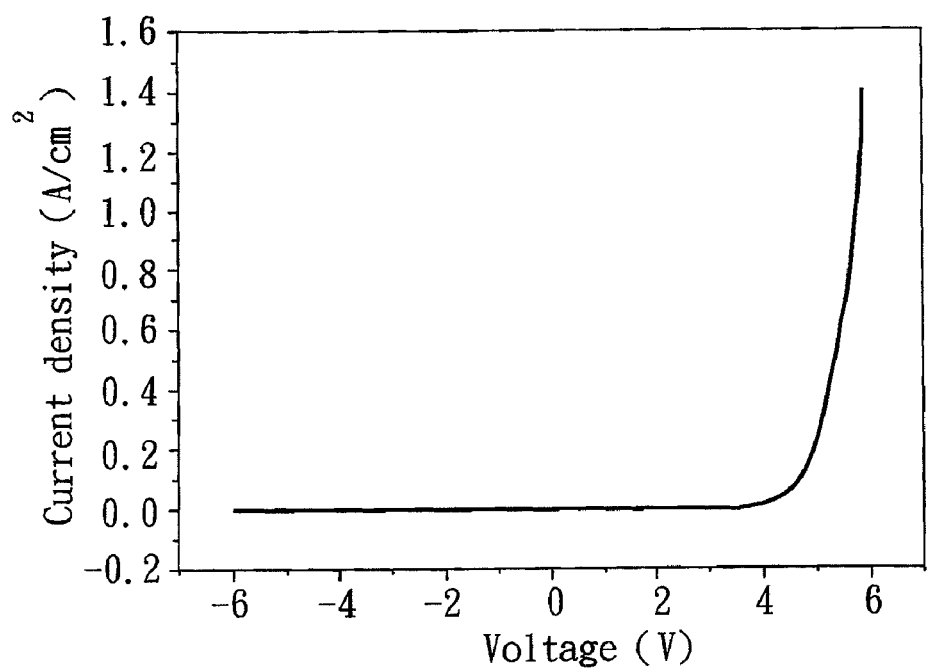
FIG. 4 is a current density-voltage curve of a Schottky diode with a diamond rod in Embodiment 2 of the present invention.

FIG. 4 is a current density-voltage curve of a Schottky diode with a diamond rod of the present embodiment.

According to the result shown in FIG. 4, the Schottky diode with a diamond rod of the present embodiment has excellent on/off characteristics, and the on/off ratio of the Schottky diode is about 10000.

In conclusion, according to the Schottky diode with a diamond rod and the method for manufacturing the same of the present invention, a polycrystalline diamond film is etched to form diamond rods, and diamond rods with single-crystalline or bi-crystalline structures are selected. The poly-crystalline diamond film is much cheaper than the single-crystalline diamond film. Hence, the single-crystalline or bi-crystalline diamond rod of the present invention is formed and selected from the poly-crystalline diamond film, so the production cost of the Schottky diode with a diamond rod of the present invention is much lower than that of the Schottky diode with a single-crystalline diamond film. In addition, the Schottky diode with a diamond rod of the present invention not only has the advantage of the low production cost, but also can be applied to MEMS switches and various electronic devices, such as switching power suppliers, position and carrier web, calculations, mixing frequency and detection web, and circuit protectors.

Although the present invention has been explained in relation to its preferred embodiment, it is to be understood that many other possible modifications and variations can be made without departing from the scope of the invention as hereinafter claimed.

What is claimed is:

1. A Schottky diode with a diamond rod, comprising:
a substrate with a gate layer formed thereon;
a patterned insulating layer disposed on the gate layer, wherein the patterned insulating layer comprises a first contact region and a second contact region;
at least one diamond rod disposed on the patterned insulating layer, wherein a first end of the diamond rod connects to the first contact region, a second end of the diamond rod connects to the second contact region, and the at least one diamond rod is respectively a single-crystalline diamond rod, or a bi-crystalline diamond rod;
a first electrode corresponding to the first contact region of the patterned insulating layer, and covering the first end of the diamond rod; and
a second electrode corresponding to the second contact region of the patterned insulating layer, and covering the second end of the diamond rod.

2. The Schottky diode with a diamond rod as claimed in claim 1, wherein the at least one diamond rod is respectively a single-crystalline diamond rod doped with boron, an intrinsic single-crystalline diamond rod, a bi-crystalline diamond rod doped with boron, or an intrinsic bi-crystalline diamond rod.

3. The Schottky diode with a diamond rod as claimed in claim 1, wherein the gate layer is an SiO2 film.

4. The Schottky diode with a diamond rod as claimed in claim 1, wherein the material of the patterned insulating layer is AlN, or SiO2.

5. The Schottky diode with a diamond rod as claimed in claim 1, wherein the first electrode is a Ti/Al bi-layered electrode and the second electrode is a Ti electrode.

6. The Schottky diode with a diamond rod as claimed in claim 1, wherein the first electrode is an ohmic electrode.

7. The Schottky diode with a diamond rod as claimed in claim 6, wherein the ohmic electrode is a Ti/Al bi-layered electrode, or a Ti/Au bi-layered electrode.

8. The Schottky diode with a diamond rod as claimed in claim 1, wherein the second electrode is a Schottky electrode.

9. The Schottky diode with a diamond rod as claimed in claim 8, wherein the Schottky electrode is an Al electrode, a Pt electrode, or an Ni electrode.

10. A method for manufacturing a Schottky diode with a diamond rod, comprising the following steps:
(A) providing a substrate with a gate layer formed thereon;
(B) forming a patterned insulating layer on the gate layer, wherein the patterned insulating layer comprises a first contact region and a second contact region;
(C) placing at least one diamond rod on the patterned insulating layer, wherein first end of the diamond rod connects to the first contact region, a second end of the diamond rod connects to the second contact region, and the at least one diamond rod is prepared through the following steps:
(1) providing a diamond film;
(2) etching the diamond film to form plural diamond rods; and
(3) selecting at least one diamond rod; and;
(D) forming a first electrode and a second electrode respectively, wherein the first electrode corresponds to the first contact region of the patterned insulating layer and covers the first end of the diamond rod, and the second electrode corresponds to the second contact region of the patterned insulating layer and covers the second end of the diamond rod.

11. The method as claimed in claim 10, wherein the diamond film is a poly-crystalline diamond film.

12. The method as claimed in claim 10, wherein the at least one diamond rod is respectively a single-crystalline diamond rod, or a bi-crystalline diamond rod.

13. The method as claimed in claim 10, wherein the at least one diamond rod is respectively a single-crystalline diamond rod doped with boron, an intrinsic single-crystalline diamond rod, a bi-crystalline diamond rod doped with boron, or an intrinsic bi-crystalline diamond rod.

14. The method as claimed in claim 10, wherein the gate layer is an SiO2 film.

15. The method as claimed in claim 10, wherein the material of the patterned insulating layer is AN, or SiO2.

16. The method as claimed in claim 10, wherein the first electrode is an ohmic electrode.

17. The method as claimed in claim 16, wherein the ohmic electrode is a Ti/Al bi-layered electrode, or a Ti/Au bi-layered electrode.

18. The method as claimed in claim 10, wherein the second electrode is a Schottky electrode.

19. The method as claimed in claim 18, wherein the Schottky electrode is an Al electrode, a Pt electrode, or an Ni electrode.

* * * * *